United States Patent
Kozono et al.

(10) Patent No.: US 11,928,288 B2
(45) Date of Patent: Mar. 12, 2024

(54) OPERATION INPUT DEVICE, OPERATION INPUT METHOD, AND NON-TRANSITORY COMPUTER-READABLE MEDIUM STORING OPERATION INPUT PROGRAM

(71) Applicant: TOYOTA JIDOSHA KABUSHIKI KAISHA, Toyota (JP)

(72) Inventors: Yuki Kozono, Okazaki (JP); Shu Nakajima, Toyota (JP); Takeshi Nawata, Iwakura (JP); Hiroshi Kato, Iwakura (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/591,745

(22) Filed: Feb. 3, 2022

(65) Prior Publication Data
US 2022/0308732 A1  Sep. 29, 2022

(30) Foreign Application Priority Data
Mar. 26, 2021 (JP) .................... 2021-054043

(51) Int. Cl.
*G06F 3/041* (2006.01)
*B60K 35/00* (2006.01)
(Continued)

(52) U.S. Cl.
CPC ............ *G06F 3/04186* (2019.05); *G06F 3/14* (2013.01); *B60K 35/00* (2013.01); *B60K 35/10* (2024.01);
(Continued)

(58) Field of Classification Search
None
See application file for complete search history.

(56) References Cited

U.S. PATENT DOCUMENTS

| 2011/0160933 A1* | 6/2011 | Suzaki | ................... B60K 35/00 |
| | | | 701/1 |
| 2014/0081521 A1* | 3/2014 | Frojdh | ................. B60R 16/037 |
| | | | 701/36 |

(Continued)

FOREIGN PATENT DOCUMENTS

| JP | 2009-129171 A | 6/2009 |
| JP | 2013-136296 A | 7/2013 |

(Continued)

*Primary Examiner* — Christopher R Lamb
(74) *Attorney, Agent, or Firm* — Oblon, McClelland, Maier & Neustadt, L.L.P.

(57) ABSTRACT

An operation input device including: a first detection section including a first detection surface that detects a position at which a detection target is touching or within a predetermined distance, the first detection section outputting a first signal representing the position; an operation control section that controls a first operation target based on the first signal; an operation determination section that outputs a second signal only when it has determined that the detection target has moved along the first detection surface; and a switching control section that switches the operation control section between an operation enabled state in which control of the first operation target is enabled, and an operation prevented state in which control of the first operation target is prevented, the switching control section switching from the operation prevented state to the operation enabled state in a case in which the second signal has been received.

10 Claims, 11 Drawing Sheets

(51) Int. Cl.
  *B62D 1/04*   (2006.01)
  *G06F 3/044*  (2006.01)
  *G06F 3/14*   (2006.01)

(52) U.S. Cl.
  CPC ...... *B60K 35/23* (2024.01); *B60K 2360/1446* (2024.01); *B62D 1/046* (2013.01); *G06F 3/044* (2013.01)

(56) References Cited

U.S. PATENT DOCUMENTS

| | | | |
|---|---|---|---|
| 2016/0107654 A1* | 4/2016 | Tan | B60K 35/00 701/36 |
| 2017/0297603 A1* | 10/2017 | Murakami | B62D 1/046 |
| 2018/0326851 A1* | 11/2018 | Kim | G06F 3/0488 |
| 2019/0009676 A1 | 1/2019 | Yokota et al. | |
| 2019/0095092 A1* | 3/2019 | Thomas | B60W 50/08 |
| 2019/0291769 A1* | 9/2019 | Kim | G06F 3/04883 |

FOREIGN PATENT DOCUMENTS

| | | |
|---|---|---|
| JP | 2018-170011 A | 11/2018 |
| WO | 2016/125304 A1 | 8/2016 |
| WO | WO 2020/196560 A1 | 10/2020 |

\* cited by examiner

OPERATION INPUT DEVICE, OPERATION INPUT METHOD, AND NON-TRANSITORY COMPUTER-READABLE MEDIUM STORING OPERATION INPUT PROGRAM

CROSS-REFERENCE TO RELATED APPLICATION

This application claims priority under 35 USC 119 from Japanese Patent Application No. 2021-054043, filed on Mar. 26, 2021, the disclosure of which is incorporated by reference herein.

BACKGROUND

Technical Field

The present disclosure relates to an operation input device, an operation input method, and a non-transitory computer-readable medium storing an operation input program is recorded.

Related Art

Japanese Patent Application Laid-open (JP-A) No. 2018-170011 discloses an invention relating to an input device. In this input device, when a predetermined operation input is performed on an input section provided in a steering wheel (an operating portion) for operating a vehicle (a transportation device), a hold state of the input device is canceled. For this reason, it is possible to inhibit a user from performing an operation input that he/she did not intend, that is, an inadvertent operation, on the input device while the vehicle is traveling, for example.

However, in JP-A No. 2018-170011, in order to cancel the hold mold of the input device, it becomes necessary for the user to touch the input section with two or more fingers, so the user needs to remove his/her hands from the steering wheel when canceling the hold mold of the input device.

SUMMARY

The present disclosure provides an operation input device, an operation input method, and a non-transitory computer-readable medium storing an operation input program that may allow a user to perform operation inputs without removing his/her hands from an operating portion of a transportation device and at the same time can inhibit inadvertent operations by the user.

A first aspect of the disclosure is an operation input device including: a first detection section, provided at an operating portion that is operable to steer a transportation device, the first detection section including a first detection surface that detects a position at which a detection target is touching or within a predetermined distance of the first detection surface as a result of a user operation, the first detection section outputting a first signal representing the position; an operation control section that controls a first operation target based on the first signal; an operation determination section that outputs a second signal only in a case where it has determined, based on the first signal, that the detection target has moved along the first detection surface while touching or being within the predetermined distance of the first detection surface; and a switching control section that switches the operation control section between an operation enabled state in which control of the first operation target by the operation control section is enabled, and an operation prevented state in which control of the first operation target by the operation control section is prevented, the switching control section switching the operation control section from the operation prevented state to the operation enabled state in a case in which the second signal has been received.

According to the first aspect of the disclosure, the first detection section is provided in the operating portion used by the user to steer the transportation device. The first detection section has the first detection surface that can detect the position where the detection target is touching or close to the detection surface as a result of an operation by the user, and the first detection section outputs the first signal representing the position. In the operation control section, control of the first operation target is performed based on the first signal that has been input from the first detection section.

In this connection, in a case where the detection target is touching or close to the detection surface as a result of an inadvertent operation by the user, it is preferred that control of the first operation target based on the first signal be prevented. To realize this, it is preferred that control of the first operation target based on the first signal be prevented during normal times and that control of the first operation target based on the first signal be enabled only in a case where a predetermined operation has been performed by the user. It is also preferred that this predetermined operation be an operation with a low potential to be inadvertently performed by the user in a state in which the user is using the operating portion.

At the same time, it is not preferred that the predetermined operation be an operation where the user must remove his/her hands from the operating portion even if the potential for the operation to be inadvertently performed in a state in which the user is using the operating portion is low.

Here, in the first aspect of this disclosure, the operation input device includes the operation determination section and the switching control section. The second signal is output from the operation determination section only in a case where the operation determination section has determined, based on the first signal, that the detection target has moved along the first detection surface while touching or being close to the first detection surface.

The switching control section can switch the operation control section between the operation enabled state in which control of the first operation target by the operation control section is enabled and the operation prevented state in which control of the first operation target by the operation control section is prevented. The switching control section switches the operation control section from the operation prevented state to the operation enabled state in a case where the second signal has been input from the operation determination section.

For this reason, in this first aspect, the operation control section can be switched from the operation prevented state to the operation enabled state as a result, for example, of the user performing on operation input on the first detection section using one finger.

A second aspect of the disclosure is the first aspect, the operating portion may include a second detection section that has a second detection surface that detects a state in which the detection target is touching or within a predetermined distance of the second detection surface, the second detection section may output a third signal in a state in which the detection target is touching or within a predetermined distance of the second detection surface, and the operation control section may control a second operation target based on the third signal.

According to the second aspect of the disclosure, the operating portion is provided with the second detection section. The second detection section has the second detection surface that can detect a state in which the detection target is touching or close to the second detection surface, and the second detection section outputs the third signal in a state in which the detection target is touching or close to the second detection surface. In the operation control section, control of the second operation target is performed based on the third signal that has been output from the second detection section.

For this reason, in the second aspect of the disclosure, for example, the second operation target can be set to an operation target that is less frequently operated than the first operation target, and the second detection section can be disposed in a position that the detection target is less likely to touch or be close to as a result of an inadvertent operation by the user than the place where the first detection section is disposed. As a result, operation targets with a low frequency of operation can be smoothly operated while inadvertent operation of operation targets with a high frequency of operation can be inhibited.

A third aspect of the disclosure is the first or second aspect, the first detection surface may be dividable into a plurality of operation regions corresponding to a plurality of the first operation targets, and the operation control section may control the first operation target corresponding to the operation region closest to the position among the plural operation regions based on the first signal.

According to the third aspect of the disclosure, the first detection surface of the first detection section is dividable into the plural operation regions corresponding to the plural first operation targets. The operation control section can perform control of the first operation target corresponding to the operation region closest to the position where the detection target is touching or close to the first detection surface among the plural operation regions of the first detection surface based on the first signal. For this reason, in the third aspect of the disclosure, operation inputs of the plural first operation targets can be performed using the first detection section.

A fourth aspect of the disclosure is any one of the first to third aspects, the switching control section may measure an amount of time in which the first signal is not being received by the operation control section in the operation enabled state, and the switching control section may switch the operation control section to the operation prevented state in a case in which the amount of time has reached a predetermined un-operated time period.

According to the fourth aspect of the disclosure, when the operation control section is in the operation enabled state, the amount of time in which the first signal is not being input to the operation control section is measured by the switching control section. In a case where the amount of time in which the first signal is not being input to the operation control section has reached the predetermined un-operated time period, the operation control section is switched to the operation prevented state by the switching control section. For this reason, in the fourth aspect of the disclosure, even if the operation control section has been switched to the operation enabled state by an inadvertent operation, when the predetermined un-operated time period elapses, the operation control section can be switched to the operation prevented state without the user performing an operation input.

A fifth aspect of the disclosure is the fourth aspect, the switching control section may change a length of the un-operated time period in accordance with a driving state of the transportation device.

According to the fifth aspect of the disclosure, the switching control section changes the length of the un-operated time period in accordance with the driving state of the transportation device. For this reason, for example, in a case where the driving state of the transportation device is a driving state in which the user is more likely to inadvertently operate the first detection section, the length of the un-operated time period can be shortened to inhibit the operation enabled state of the operation control section from being maintained as a result of an inadvertent operation of the first detection section by the user.

A sixth aspect of the disclosure is any one of the first to fifth aspects, may further include: a display section; and a display control section that controls the display section and that receives the second signal, wherein the display control section may switch the display section to a first display state indicating the operation enabled state in a case in which the second signal has been received, and may switch the display section to a second display state indicating the operation prevented state in a case in which the second signal is not being received.

According to the sixth aspect of the disclosure, the operation input device includes the display section that the user can view and the display control section that can control the display section and to which the second signal can be input. The display control section switches the display section to the first display state indicating the operation enabled state in a case where the second signal has been input. Alternatively, in a case where the second signal is not being input to the display control section, the display control section switches the display section to the second display state indicating the operation prevented state. For this reason, the user can visually check whether or not the first operation target is in an operable state.

A seventh aspect of the disclosure is an operation input method including: detecting a position at which, as a result of a user operation, a detection target is touching or within a predetermined distance of a detection surface of a detection section provided at an operating portion that is operable to steer a transportation device; outputting, from the detection section, a first signal representing the position; outputting a second signal, from an operation determination section, only in a case in which the operation determination section has determined, based on the first signal, that the detection target has moved along the detection surface while touching or being within a predetermined distance of the detection surface; switching, by a switching control section, an operation control section to an operation enabled state in which control of an operation target by the operation control section is enabled in a case in which the second signal has been input to the switching control section; and switching, by the switching control section, the operation control section to an operation prevented state in which control of the operation target by the operation control section is prevented in a case in which the second signal is not input to the switching control section. [0025] According to the seventh aspect of the disclosure, first the method detects the position where, as a result of an operation by the user, the detection target is touching or close to the detection surface of the detection section provided in the operating portion used to steer the transportation device.

Next, the method outputs from the detection section the first signal representing the position where the detection target is touching or close to the detection surface.

Next, the method outputs the second signal from the operation determination section only in a case where the operation determination section has determined, based on the first signal, that the detection target has moved along the detection surface while touching or being close to the detection surface.

In a case where the second signal has been input to the switching control section, the operation control section is switched by the switching control section to the operation enabled state in which control of the operation target by the operation control section is enabled. Alternatively, in a case where the second signal is not input to the switching control section, the operation control section is switched by the switching control section to the operation prevented state in which control of the operation target by the operation control section is prevented.

For this reason, in the seventh aspect of the disclosure, the operation control section can be switched from the operation prevented state to the operation enabled state as a result, for example, of the user performing an operation input on the detection section using one finger.

An eighth aspect of the disclosure is a non-transitory computer-readable medium in which is recorded an operation input program that causes a computer to execute: detecting a position in which a detection target is touching or within a predetermined distance of a detection surface of a detection section provided at an operating portion used to steer a transportation device; outputting, from the detection section, a first signal representing the position; outputting a second signal, from an operation determination section, only in a case in which the operation determination section has determined, based on the first signal, that the detection target has moved along the detection surface while touching or being within a predetermined distance of the detection surface; switching, via a switching control section, an operation control section to an operation enabled state in which control of an operation target by the operation control section is enabled in a case in which the second signal has been input to the switching control section; and switching, by the switching control section, the operation control section to an operation prevented state in which control of the operation target by the operation control section is prevented in a case in which the second signal is not input to the switching control section.

For this reason, in the eighth aspect of the disclosure, the operation control section can be switched from the operation prevented state to the operation enabled state as a result, for example, of the user performing an operation input on the detection section using one finger.

According to the above aspects, the operation input device, the operation input method, and the non-transitory computer-readable medium storing the operation input program of the present disclosure can allow a user to perform operation inputs without removing his/her hands from an operating portion of a transportation device and at the same time can inhibit inadvertent operations by the user.

BRIEF DESCRIPTION OF THE DRAWINGS

An exemplary embodiment will be described in detail based on the following figures, wherein.

DETAILED DESCRIPTION

Figure 5:
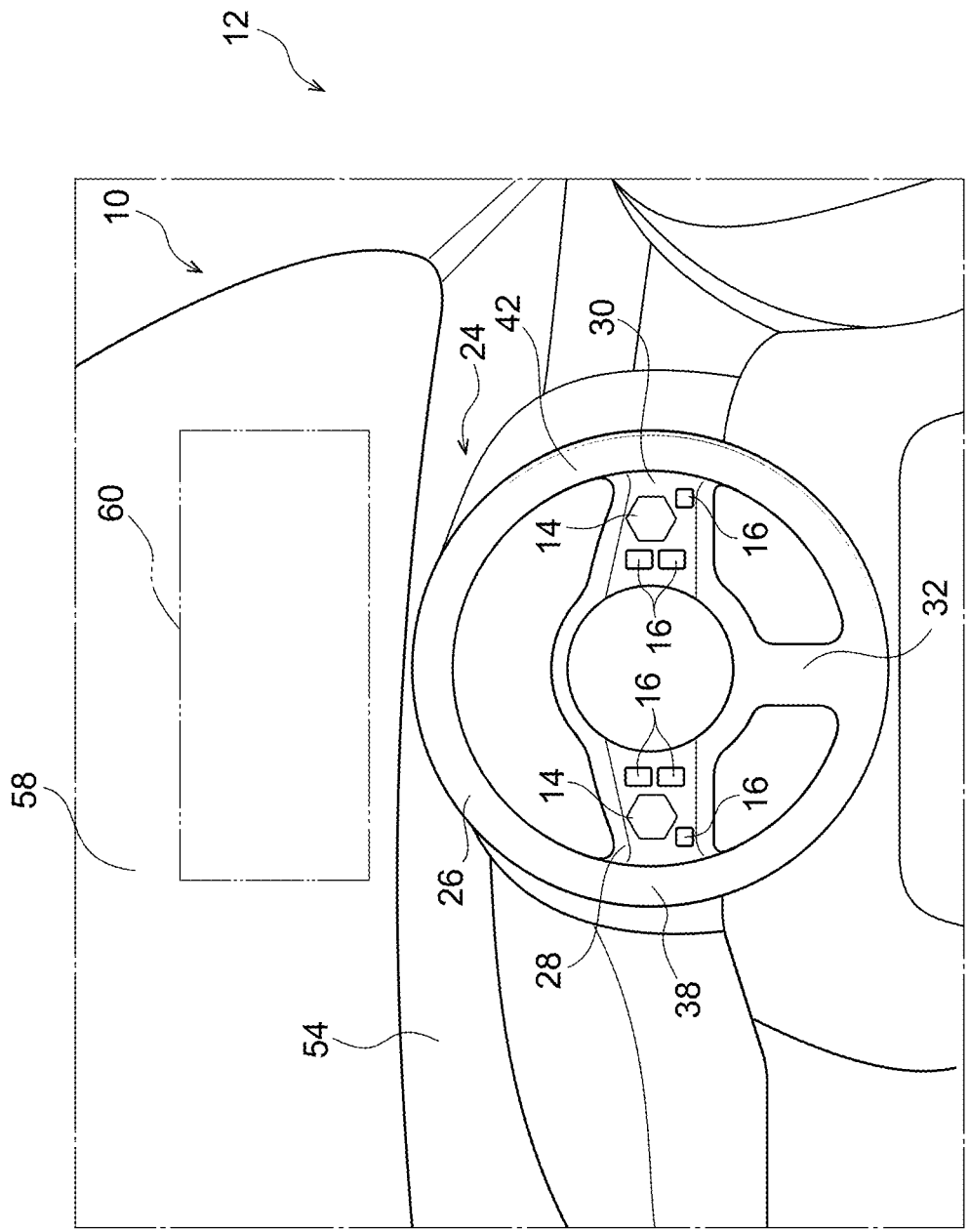
FIG. 5 is a front view schematically showing the overall configuration of the operation input device pertaining to the exemplary embodiment.

An example of an embodiment of an operation input device pertaining to the disclosure will be described below using FIG. 1 to FIG. 11. As shown in FIG. 5, an operation input device 10 pertaining to the exemplary embodiment is provided in a vehicle 12 serving as a transportation device. The operation input device 10, as shown also in FIG. 3, includes touch pads 14 serving as a first detection section, touch pads 16 serving as a second detection section, pressure sensors 18, a head-up display 20, a control device 22, and various electronic control sections (ECUs).

The vehicle 12 includes a steering wheel 24 serving as an operating portion used to steer the vehicle 12. The steering wheel 24 is configured to include an annular rim portion 26 that configures an outer peripheral portion of the steering wheel 24, a boss portion (not shown in the drawings) that is secured to a steering shaft (not shown in the drawings) and is positioned in the center of the rim portion 26, and a spoke portion 28, a spoke portion 30, and a spoke portion 32 that interconnect the boss portion and the rim portion 26 in the radial direction of the rim portion 26. It will be noted that, below, the steering wheel 24 will be described assuming that the spoke portion 28 is positioned on the vehicle width direction left side of the boss portion, the spoke portion 30 is positioned on the vehicle width direction right side of the boss portion, and the spoke portion 32 is positioned on the vehicle lower side of the boss portion.

Figure 6:
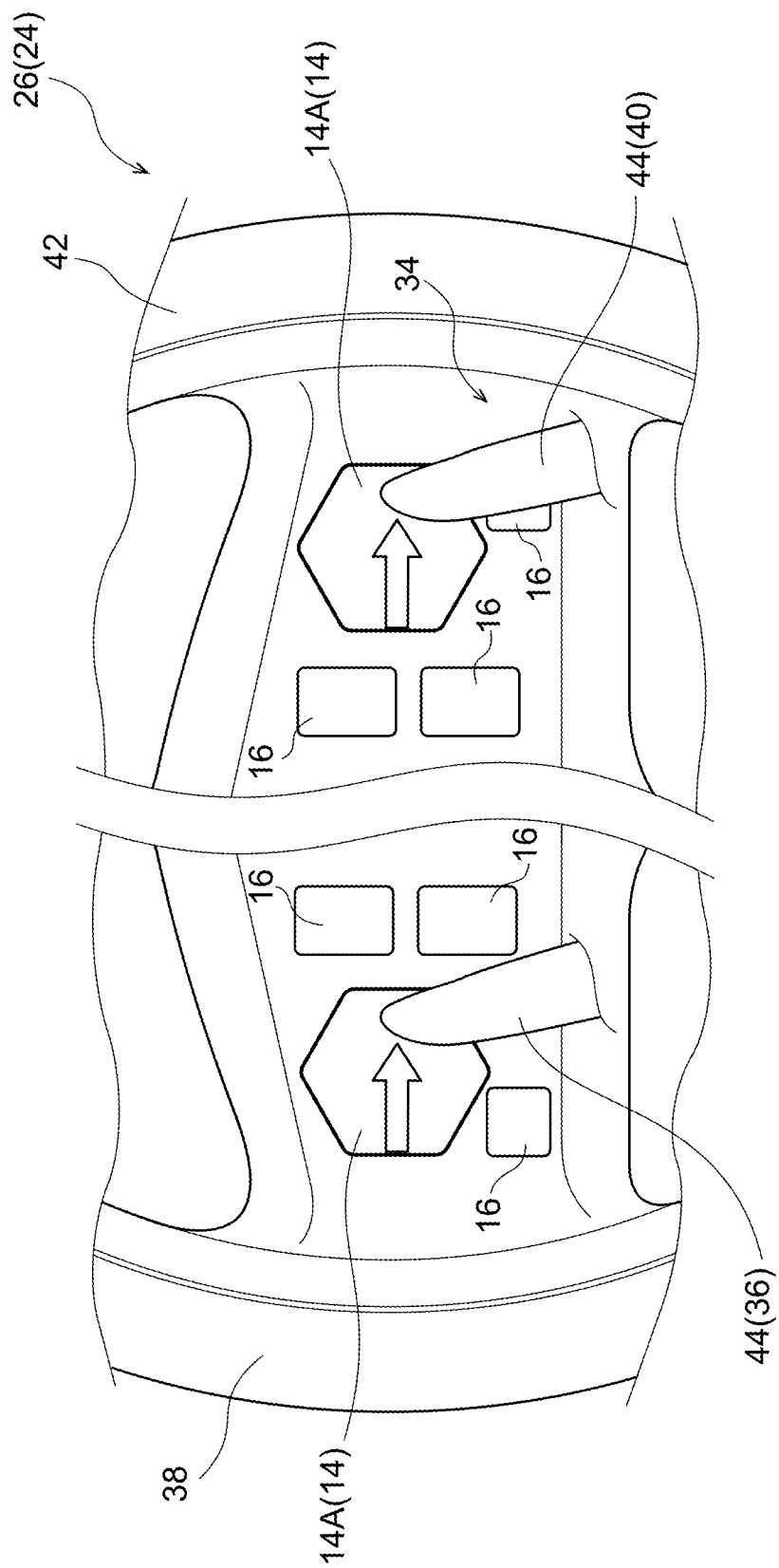
FIG. 6 is an explanatory drawing showing a cancelation operation performed on the operation input device pertaining to the exemplary embodiment.

It will be noted that in this exemplary embodiment, as shown also in FIG. 6, the portion of the rim portion 26 that borders the spoke portion 28 serves as a grip portion 38 that a driver 34 serving as a user can grip with his/her left hand 36, and the portion of the rim portion 26 that borders the spoke portion 30 serves as a grip portion 42 that the driver 34 can grip with his/her right hand 40. The touch pads 14 are provided in the spoke portion 28 in the neighborhood of the grip portion 38 and in the spoke portion 30 in the neighborhood of the grip portion 42 in a surface 24A of the steering wheel 24 on the driver 34 side.

Figure 1:
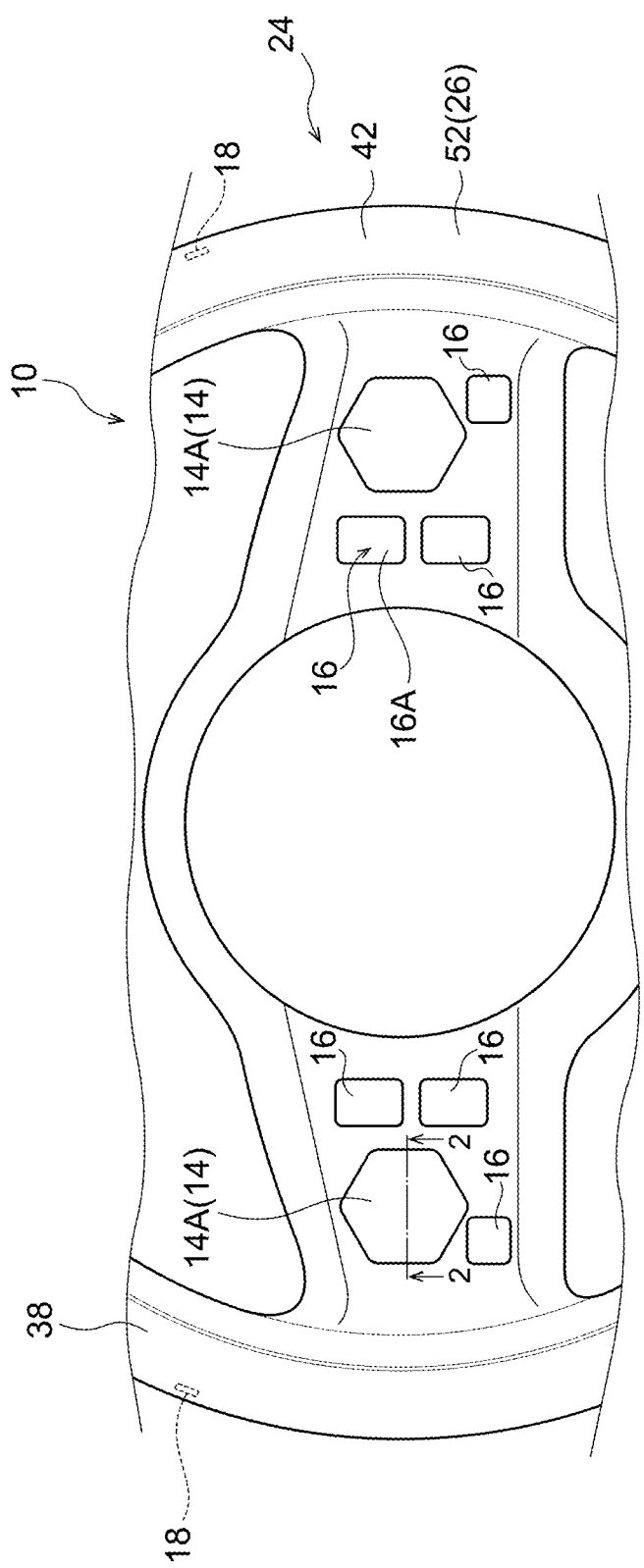
FIG. 1 is a front view schematically showing configurations of main portions of an operation input device pertaining to the exemplary embodiment.

As shown in FIG. 1, the touch pads 14 are hexagonal pads as seen from the driver 34 side, and are capacitive sensors having detection surfaces 14A serving as a first detection surface exposed to the driver 34 side. The detection surfaces 14A can detect a state in which a finger 44 of the driver 34 serving as a detection target is touching or close to (namely, within a predetermined distance) the detection surfaces 14A as a result of an operation by the driver 34.

More specifically, plural electrodes (not shown in the drawings) are disposed in the touch pads 14. The touch pads 14 can detect, with the electrodes, the position where the finger 44 is touching or close to the detection surfaces 14A, and the touch pads 14 can output a signal S1 serving as a first signal representing the position. As described later, various operation targets are operated based on the signal S1. It will be noted that the position of the finger 44 detected by the detection surfaces 14A may be a proximate place in the detection surfaces 14A that is closest to the finger 44, or may be a predetermined place in the detection surfaces 14A in a range positioned within a predetermined distance from the finger 44.

Figure 2:
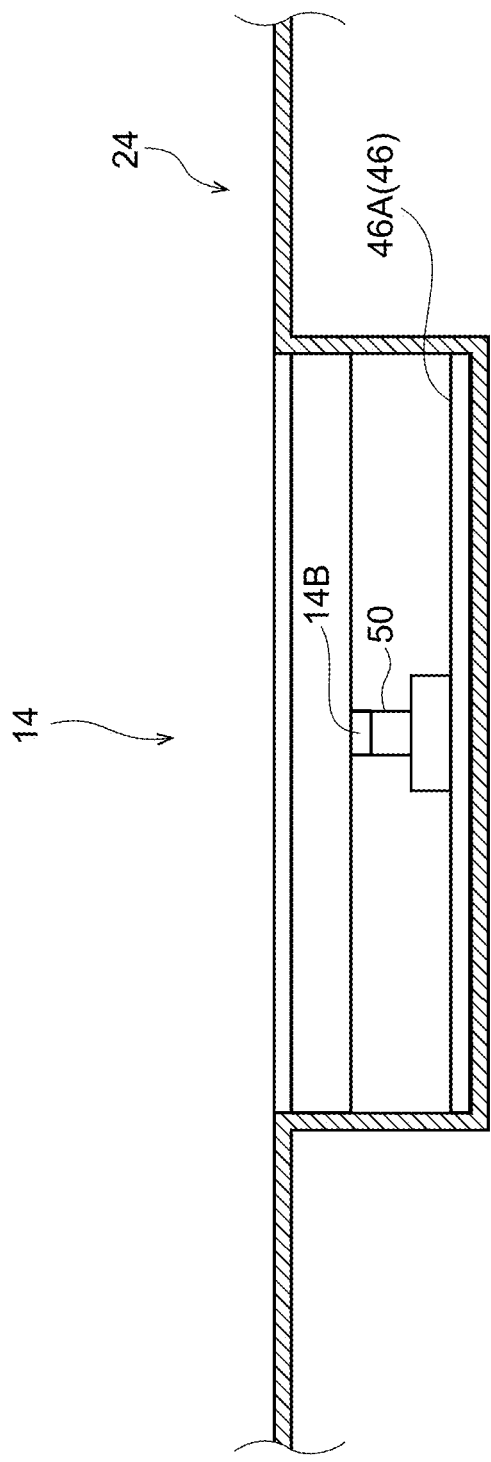
FIG. 2 is a sectional view (a sectional view cut along line 2-2 of FIG. 1) schematically showing configurations of main portions of the operation input device pertaining to the exemplary embodiment.

As shown in FIG. 2, each of the touch pads 14 is contained in a recessed portion 46 provided in the steering wheel 24. A projecting portion 14B is provided at a portion of the touch pad 14 on the opposite side of the detection surface 14A. A tactile switch 50 is provided on a bottom portion 46A of the recessed portion 46, and the projecting portion 14B of the touch pad 14 is supported by the restoring force of the tactile switch 50. When the touch pad 14 is pressed by the driver 34, the tactile switch 50 is pressed by the touch pad 14 and a signal ST is output from the tactile switch 50.

As shown in FIG. 1, the touch pads 16 are quadrilateral pads with a smaller surface area than the touch pads 14 as seen from the driver 34 side, and there are plural (in this exemplary embodiment, three as an example) touch pads 16 disposed around each of the touch pads 14. The touch pads 16 have basically the same configuration as the touch pads 14, and are capacitive sensors having detection surfaces 16A serving as a second detection surface exposed to the driver 34 side.

The touch pads 16 can output a signal S3 serving as a third signal in a state in which the finger 44 of the driver 34 is touching or close to the detection surfaces 16A. The steering wheel 24 is provided with tactile switches 50 in positions coinciding with the touch pads 16 as seen from the driver 34 side.

It will be noted that the touch pads 14 and the touch pads 16 may be provided independently to the steering wheel 24, and the detection surfaces 14A and the detection surfaces 16A may be configured to share the members in common.

The pressure sensors 18 are disposed in the grip portion 38 and the grip portion 42 and are provided in the rim portion 26 between a core (not shown in the drawings) and a cover 52. The pressure sensors 18 can detect pressure acting on the grip portion 38 and the grip portion 42, and a signal SP according to the pressure acting on the pressure sensors 18 is output from the pressure sensors 18.

Figure 3:
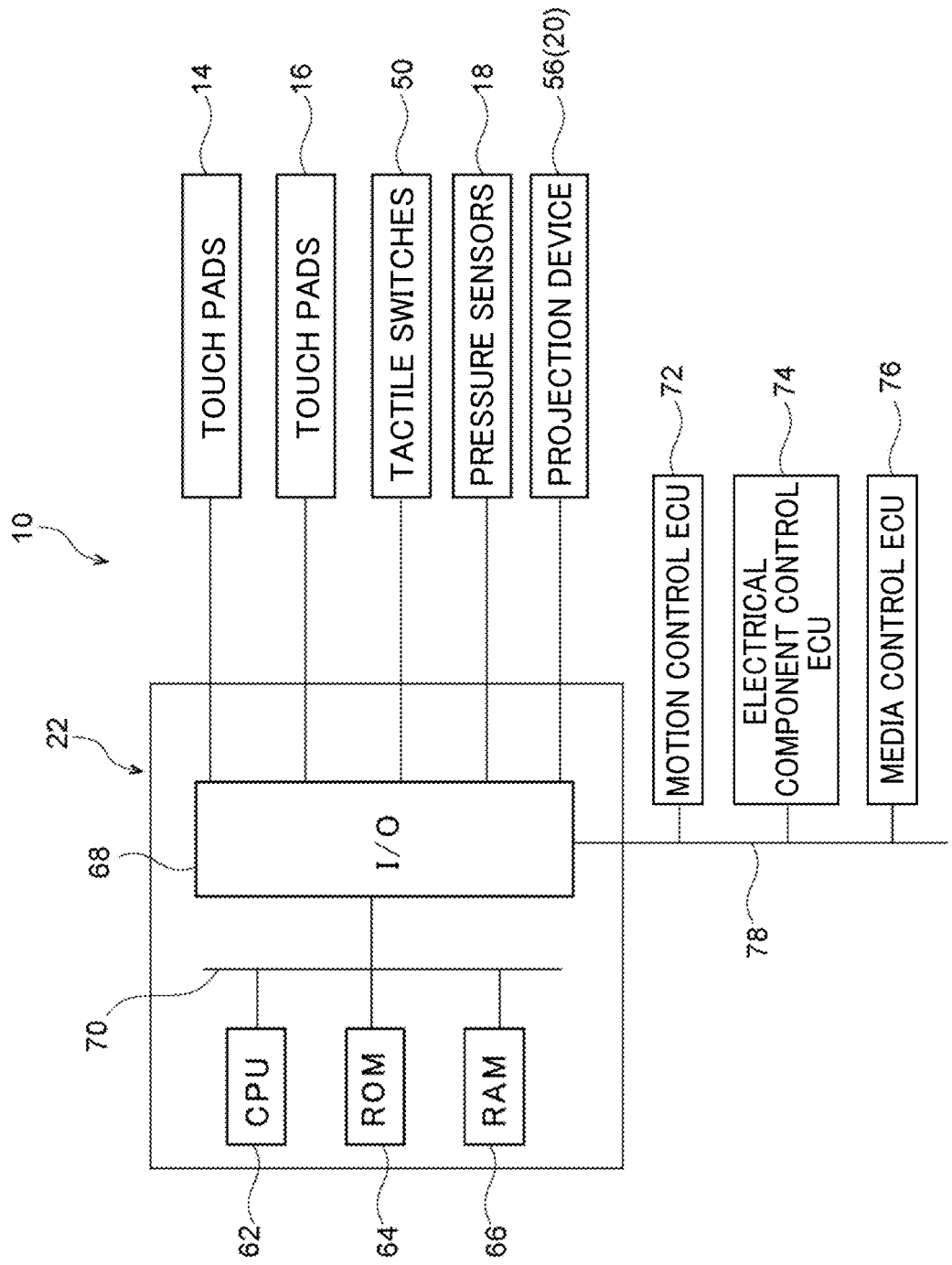
FIG. 3 is a block diagram showing hardware configurations in the operation input device pertaining to the exemplary embodiment.
Figure 4:
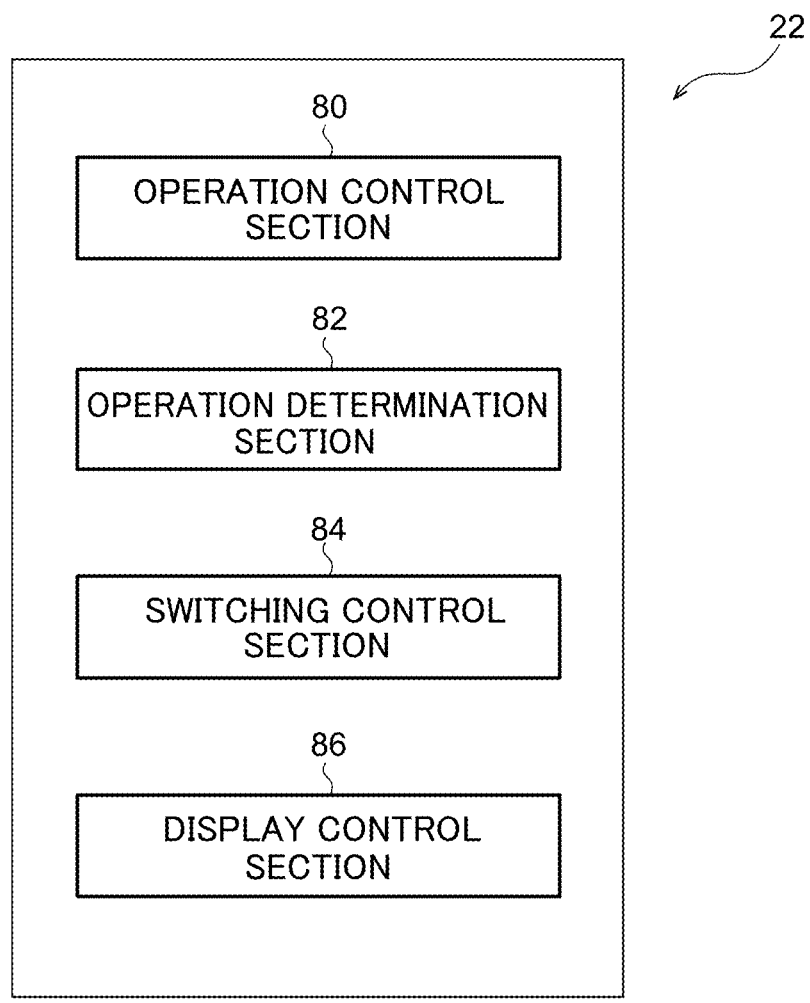
FIG. 4 is a block diagram showing functional configurations of the operation input device pertaining to the exemplary embodiment.

As shown in FIG. 3 and FIG. 5, the head-up display 20 includes a projection device 56 disposed in a dashboard 54 and a projection surface 60 serving as a display section provided in a windshield glass 58. As described later, the projection device 56 can project various images on the projection surface 60 as a result of being controlled by the control device 22.

As shown in FIG. 3, the control device 22 includes a central processing section (CPU) 62 that is an example of a processor that is hardware, a read-only memory (ROM) 64, a random-access memory (RAM) 66, and an input/output interface (I/O) 68. The CPU 62, the ROM 64, the RAM 66, and the I/O 68 are connected to each other via a bus 70. It will be noted that the control device 22 may also include a non-volatile memory such as a hard disk drive (HDD) or a solid-state drive (SSD).

The ROM 64 stores an operation program for causing the CPU 62 to execute processes pertaining to the touch pads 14 and the touch pads 16 and image data that the head-up display 20 is made to display.

The CPU 62 is a central processing section, executes various programs, and controls each section of the control device 22. Specifically, the CPU 62 reads various programs from the ROM 64 and executes the programs using the RAM 66 as a workspace. The CPU 62 also controls constituent elements connected to the I/O 68 and performs various arithmetic processes in accordance with these programs.

Connected to the I/O 68 are the touch pads 14, the touch pads 16, the tactile switches 50, the pressure sensors 18, and the projection device 56. A motion control ECU 72, an electrical component control ECU 74, and a media control ECU 76 are also connected via a controller area network (CAN) 78 to the I/O 68.

The motion control ECU 72 performs control of the motion of the vehicle 12 in cooperation with other ECUs, such as an engine ECU and a brake ECU (not shown in the drawings). For example, the motion control ECU 72 performs control pertaining to cruise control of the vehicle 12 and control pertaining to various drive modes of the vehicle 12.

The electrical component control ECU 74 performs control of various electrical components installed in the vehicle 12. For example, the electrical component control ECU 74 performs control of an air conditioning system (not shown in the drawings), various monitors (not shown in the drawings), and lights (not shown in the drawings).

The media control ECU 76 performs control of various information devices installed in the vehicle 12. For example, the media control ECU 76 performs control of an audio device and a telephone (not shown in the drawings).

The control device 22 configured as described above can operate various devices installed in the vehicle 12 based on the signal S1 that has been output as a result of the driver 34 operating the touch pads 14. The driver 34 can check the operation targets of the touch pads 14 using the various images displayed on the projection surface 60. Functional configurations of the control device 22 will be described below using FIG. 4.

The control device 22 is configured to include an operation control section 80, an operation determination section 82, a switching control section 84, and a display control section 86 as functional constituent elements. It will be noted that each functional configuration is realized as a result of the CPU 62 reading and executing the programs stored in the ROM 64.

Figure 7:
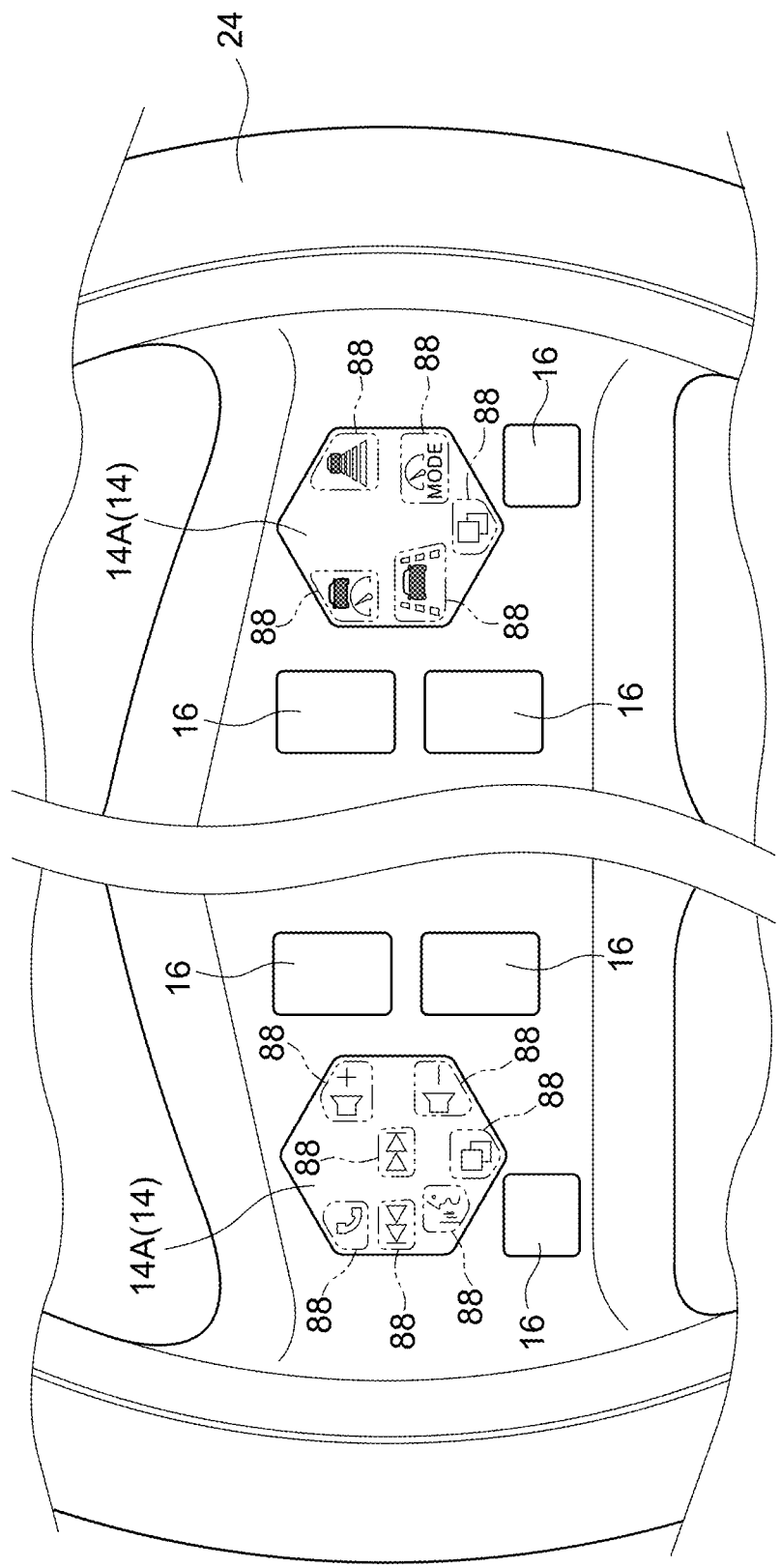
FIG. 7 is a figure showing an example of the allocation of operation regions in touch pads of the operation input device pertaining to the exemplary embodiment.

The operation control section 80 performs control of the various operation targets based on the signal ST, the signal S1, and the signal S3. Specifically, as shown in FIG. 7, the detection surfaces 14A of the touch pads 14 are divided into plural operation regions 88, and these operation regions 88 correspond to different operation targets.

For example, in the detection surface 14A of the touch pad 14 on the vehicle width direction left side, the operation regions 88 are set to correspond to the telephone and the audio device. On the detection surface 14A of the touch pad 14 on the vehicle width direction right side, the operation regions 88 are set to correspond to the cruise control and the drive modes. That is, in the above-described settings, the telephone, the audio device, the cruise control, and the drive modes can be regarded as first operation targets.

The operation control section 80 identifies the operation region 88 that the driver 34 is operating based on the signal S1 (that is, the operation input by the driver 34) and performs predetermined control of the operation target serving as the target based on the signal S1. Note that FIG. 7 shows images of pictograms representing the operation targets corresponding to the operation regions 88 in the detection surfaces 14A to facilitate understanding of the settings of the operation regions 88.

The touch pads 16 can be used for operation inputs by the driver 34 to operate the lights, for example, which are not the operation targets of the touch pads 14. Namely, in the above-described settings, the lights can be regarded as second operation targets. It will be noted that the operation targets corresponding to the operation regions and the operation targets corresponding to the touch pads 16 can be changed as appropriate.

Furthermore, the operation control section 80 receives operation inputs based on the signal S1 and the signal S3 in a state in which the signal ST is being input, and does not receive operation inputs based on the signal S1 and the signal S3 in a state in which the signal ST is not being input. That is, when the driver 34 operates the touch pads 14 and the touch pads 16, the driver 34 needs to depress the touch pads 14 and the touch pads 16 until the tactical switches 50 output the signal ST.

The operation determination section 82 outputs a signal S2 serving as a second signal to the switching control section 84 and the display control section 86 only in a case where it has determined, based on the signal S1, that the finger 44 of the driver 34 has moved along the detection surfaces 14A of the touch pads 14 (the driver 34 has performed a swipe operation) while touching or being close to the detection surfaces 14A as shown in FIG. 6.

Specifically, the operation determination section 82 acquires the coordinates of the finger 44 of the driver 34 every predetermined amount of time based on the signal S1. The operation determination section 82 determines that the driver 34 has performed a swipe operation and outputs the signal S2 in a case where the coordinates of the finger 44 have moved a predetermined distance within a predetermined amount of time. In this exemplary embodiment, as an example, the operation determination section 82 is set to output the signal S2 when the coordinates of the finger 44 have linearly moved 3 mm or more within 3 seconds. However, the operation determination section 82 is not limited to this, and the setting can be changed as appropriate, such as setting the operation setting section 82 to output the signal S2 when the coordinates of the finger 44 have linearly moved 3 mm or more within 5 seconds.

The operation determination section 82 outputs a signal S4 representing the coordinates of the finger 44 it has acquired based on the signal S1.

The signals SP from the pressure sensors 18 are also input to the operation determination section 82, and the operation determination section 82 calculates the magnitude of the pressure acting on the grip portion 38 and the grip portion 42 based on the signals SP. In a case where the value of the pressure is smaller than a predetermined value, output of the signal S2 from the operation determination section 82 is prevented. Namely, the signal S2 is output from the operation determination section 82 in a case where the driver 34 has performed a swipe operation on the detection surfaces 14A of the touch pads 14 while the driver 34 is gripping the grip portion 34 and the grip portion 42.

The switching control section 84 can switch the operation control section 80 between an operation enabled state in which control of the operation targets of the touch pads 14 by the operation control section 80 is enabled and an operation prevented state in which control of the operation targets by the operation control section 80 is prevented.

Specifically, the switching control section 84 switches the operation control section 80 to the operation enabled state in a case where the signal S2 has been input from the operation determination section 82 and switches the operation control section 80 to the operation prevented state in a case where the second signal S2 is not input.

The switching control section 84 also measures the amount of time in which the signal S1 is not being input to the operation control section 80 in the operation enabled state and switches the operation control section 80 to the operation prevented state when the amount of time reaches a predetermined un-operated time period TN. It will be noted that during normal times the switching control section 84 is set to switch the operation control section 80 to the operation prevented state.

The switching control section 84 can also change the length of the un-operated time period TN in accordance with the driving state of the vehicle 12. Specifically, the switching control section 84 can determine the traveling state of the vehicle 12 based on signals from an acceleration sensor and the like (not shown in the drawings). In this exemplary embodiment, as an example, the switching control section 84 sets the un-operated time period TN to 3 seconds when it determines the vehicle 12 is traveling straight or equivalent to straight, and sets the un-operated time period TN to a time period shorter than 3 seconds when it determines that the vehicle 12 is turning or equivalent to turning.

The display control section 86 switches the projection surface 60 to a first display state indicating the operation enabled state when the signal S2 has been input from the operation determination section 82. Alternatively, in a state in which the signal S2 is not being input to the display control section 86, the display control section 86 switches the projection surface 60 to a second display state indicating the operation prevented state.

Figure 9:
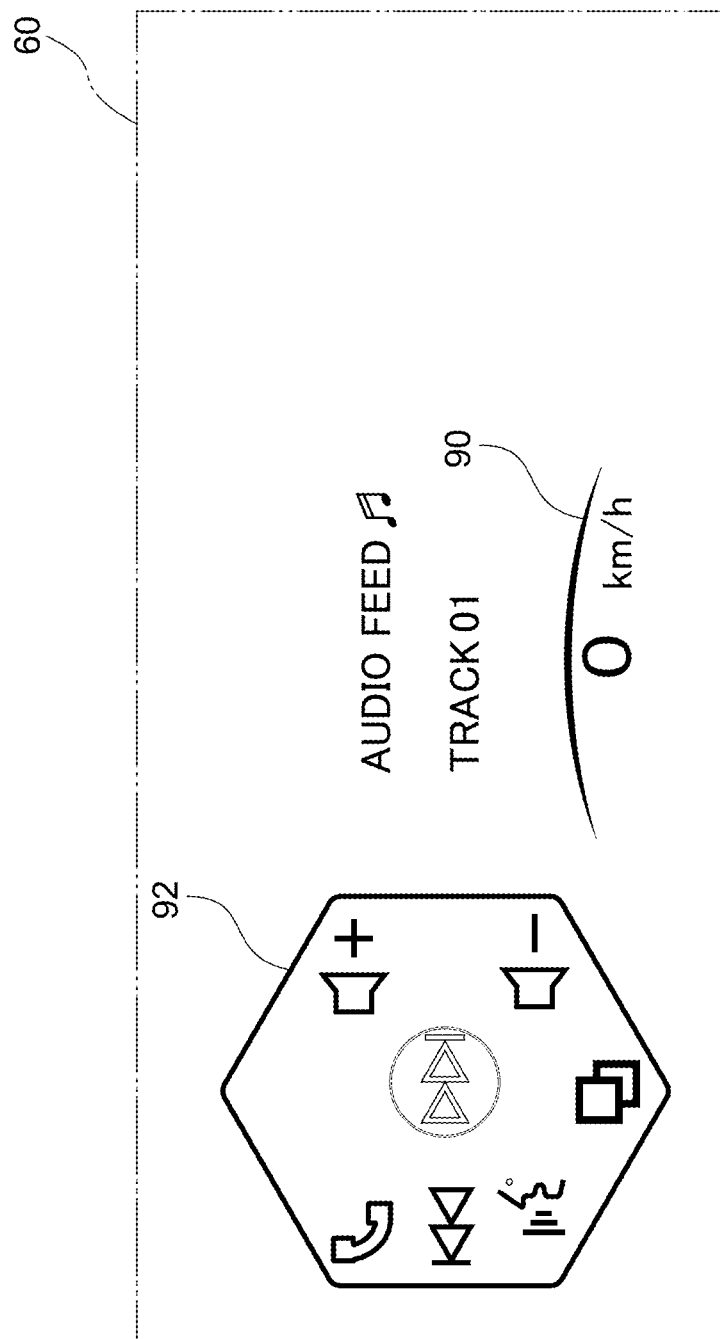
FIG. 9 is a figure showing an example of a display state of the head-up display in a state in which operations using a touch pad are enabled in the operation input device pertaining to the exemplary embodiment.
Figure 10:
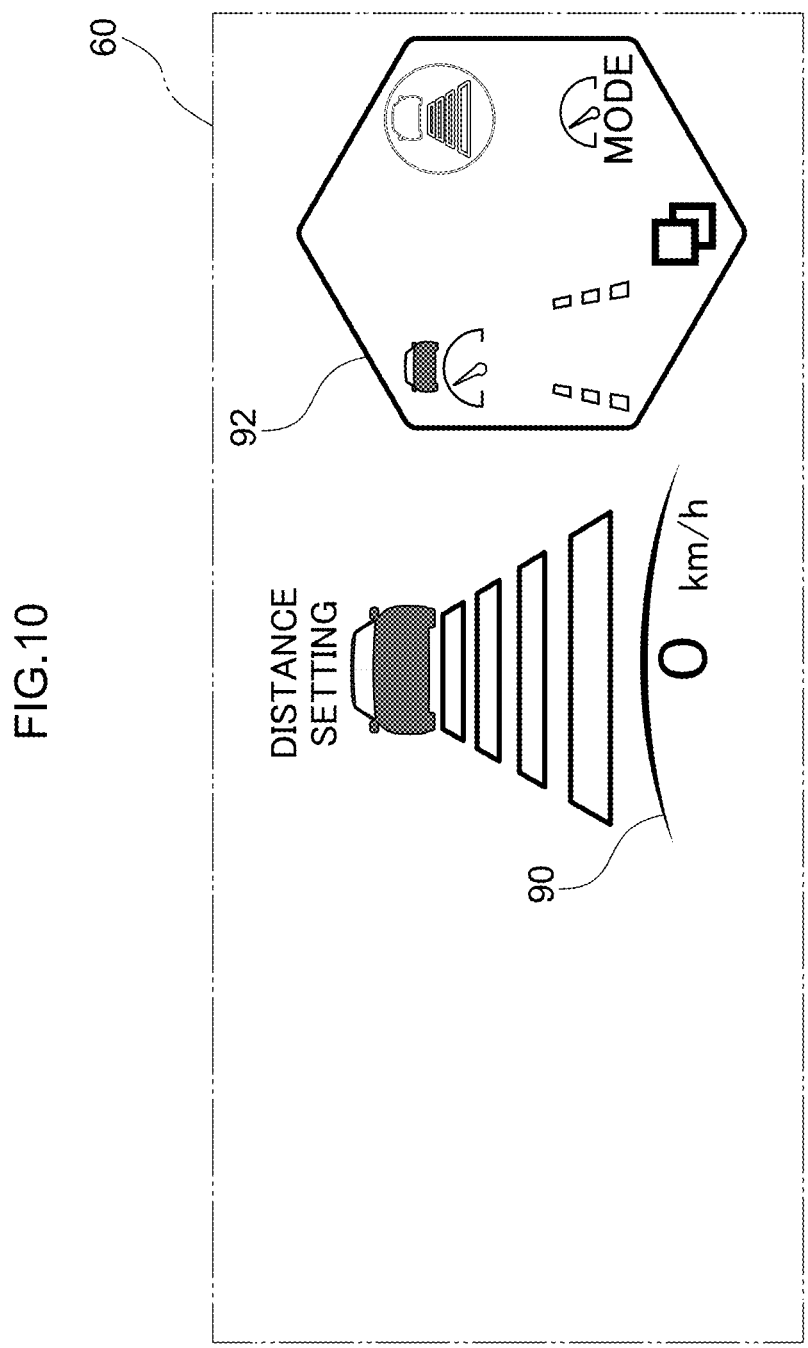
FIG. 10 is a figure showing an example of a display state of the head-up display in a state in which operations using a touch pad are enabled in the operation input device pertaining to the exemplary embodiment.
Figure 11:
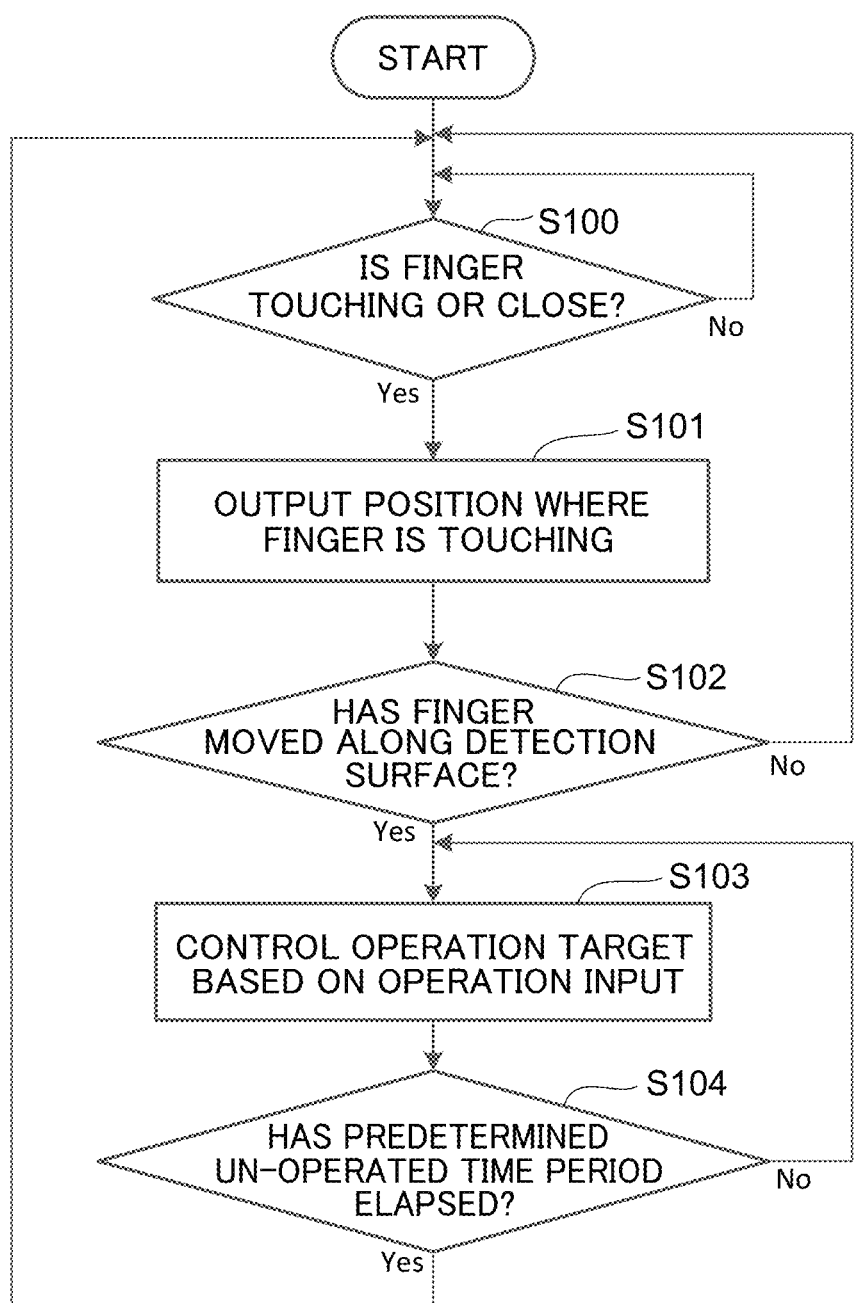
FIG. 11 is a flowchart showing a control flow of the operation input device pertaining to the exemplary embodiment.

Here, as shown in FIG. 9 and FIG. 10, the first display state is a state in which a standard information image 90 relating to the vehicle 12 and a guide image 92 corresponding to the operation regions of the detection surfaces 14A of the touch pads 14 are displayed.

More specifically, the standard information image 90 is displayed in the vehicle lower section of the central portion of the projection surface 60, and is an image that includes basic information relating to the vehicle 12 such as the vehicle speed.

The guide image 92 is displayed in the vehicle width direction outer sections of the projection surface 60 and on the vehicle upper side of the standard information image 90. An image representing the operation regions of the touch pad 14 on the vehicle width direction left side is displayed in the vehicle width direction left-side section of the projection surface 60, and an image representing the operation regions of the touch pad 14 on the vehicle width direction right side is displayed in the vehicle width direction right-side section of the projection surface 60.

Furthermore, an image relating to the operation target of the operation region 88 that the driver 34 is operating is displayed on the vehicle upper side of the standard information image 90. The display control section 86 can cause the operation input by the driver 34 to be reflected in the guide image 92 based on the signal S4. It will be noted that in this exemplary embodiment, as an example, the brightness of the section of the guide image 92 corresponding to the operation target that the driver 34 is operating is changed.

Figure 8:
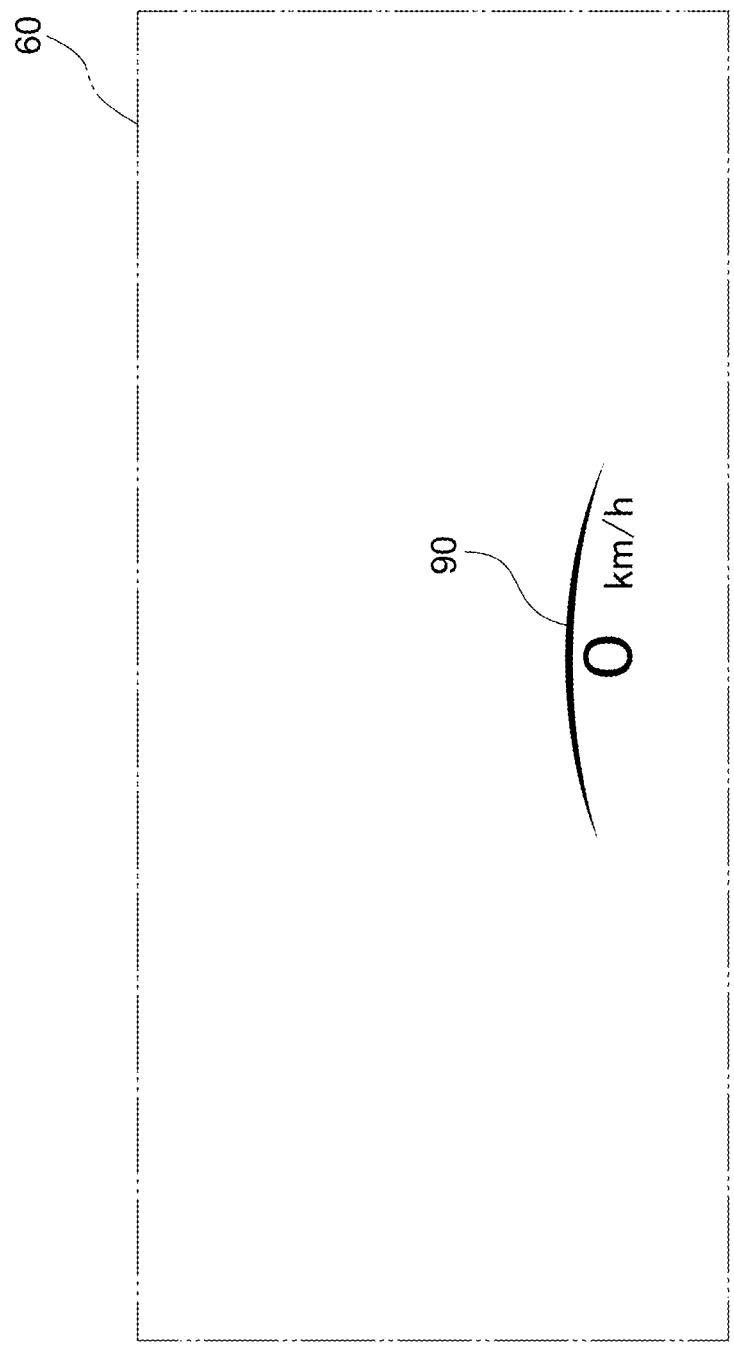
FIG. 8 is a figure showing a display state of a head-up display in a state in which operations using the touch pads are not enabled in the operation input device pertaining to the exemplary embodiment.

As shown in FIG. 8, in the second display state, only the standard information image 90 is displayed on the projection surface 60.

Next, the action of this exemplary embodiment will be described.

First, a control flow of the operation input device 10 resulting from the program executed by the CPU 62 will be described. This control flow is started as a result of the CPU 62 receiving a predetermined instruction signal.

When this control flow is started, in step S100 the CPU 62 detects a state in which the finger 44 of the driver 34 is touching or close to the detection surface 14A of a touch pad 14. In a case where a state in which the finger 44 is touching or close to the detection surface 14A has been detected (step S100: YES), the CPU 62 proceeds to step S101, and in a case where a state in which the finger 44 is touching or close to the detection surface 14A has not been detected (step S100: NO), the CPU 62 repeats step S100.

In step S101 the CPU 62 outputs from the touch pad 14 the signal S1 indicating the position where the finger 44 is touching or close to the detection surface 14A, and then the CPU 62 proceeds to step S102.

In step S102 the CPU 62 determines, based on the signal S1, whether or not the finger 44 has moved along the detection surface 14A while touching or being close to the detection surface 14A. In a case where the CPU 62 has determined that the finger 44 has moved along the detection surface 14A while touching or being close to the detection surface 14A (step S102: YES), the CPU 62 proceeds to step S103, and in a case where the CPU 62 has determined that the finger 44 has not moved along the detection surface 14A while touching or being close to the detection surface 14A (step S102: NO), the CPU 62 returns to step S100.

In step S103 the CPU 62 switches the operation input device 10 to the operation enabled state in which operation of the operation target by the touch pad 14 is enabled and controls the operation target based on the operation input on the touch pad 14 by the driver 34, and then the CPU 62 proceeds to step S104.

In step S104 the CPU 62 measures the amount of time in which the signal S1 is not being input to the control device 22. In a case where the amount of time has reached the predetermined un-operated time period TN (step S104: YES), the CPU 62 returns to step S100, and in a case where the amount of time has not reached the predetermined un-operated time period (step S104: NO), the CPU 62 returns to step S103.

Then, when the CPU 62 receives a predetermined stop signal, it ends the control flow.

For this reason, in this exemplary embodiment, the operation control section 80 can be switched from the operation prevented state to the operation enabled state as a result, for example, of the driver 34 performing an operation input on the touch pad 14 using one finger 44.

Furthermore, in this exemplary embodiment, as shown in FIG. 1, the steering wheel 24 is provided with the touch pads 16. The touch pads 16 have the detection surfaces 16A that can detect a state in which the finger 44 of the driver 34 is touching or close to the detection surfaces 16A, and the touch pads 16 output the signal S3 in a state in which the finger 44 is touching or close to the detection surfaces 16A. In the operation control section 80, control of the operation targets is performed based on the signal S3 that has been output from the touch pads 16.

For this reason, in this exemplary embodiment, for example, the operation targets of the touch pads 16 can be set to operation targets that are less frequently operated than the operation targets of the touch pads 14, and the touch pads 16 can be disposed in positions that the fingers 44 are less likely to touch or be close to as a result of an inadvertent operation by the driver 34 than the places where the touch pads 14 are disposed. For example, in a state in which the driver 34 is gripping the grip portion 38 and the grip portion 42 of the steering wheel 24, the touch pads 16 can be disposed in positions that the thumbs of the driver 34 do not easily touch, and the touch pads 14 can be disposed in positions that the thumbs of the driver 34 easily touch. As a result, operation targets with a low frequency of operation can be smoothly operated while inadvertent operation of operation targets with a high frequency of operation can be inhibited.

Furthermore, in this exemplary embodiment, the detection surfaces 14A of the touch pads 14 are dividable into the plural operation regions 88 corresponding to the plural operation targets. The operation control section 80 can perform control of the operation target corresponding to the operation region 88 closest to the position where the finger 44 of the driver 34 is touching or close to the detection surfaces 14A among the plural operation regions 88 of the detection surfaces 14A based on the signal S1. For this reason, in this exemplary embodiment, operation inputs of the plural operation targets can be performed using the touch pads 14.

Furthermore, in this exemplary embodiment, when the operation control section 80 is in the operation enabled state, the amount of time in which the signal S1 is not being input to the operation control section 80 is measured by the switching control section 84. In a case where the amount of time in which the signal S1 is not being input to the operation control section 80 has reached the predetermined un-operated time period TN, the operation control section 80 is switched to the operation prevented state by the switching control section 80. For this reason, in this exemplary embodiment, even if the operation control section 80 has been switched to the operation enabled state by an inadvertent operation, when the predetermined un-operated time period TN elapses, the operation control section 80 can be switched to the operation prevented state without the driver 34 performing an operation input.

Furthermore, in this exemplary embodiment, the switching control section 84 changes the length of the un-operated time period TN in accordance with the driving state of the vehicle 12. For this reason, for example, in a case where the driving state of the vehicle 12 is a driving state in which the driver 34 is more likely to inadvertently operate the touch pads 14, the length of the un-operated time period TN can be shortened to inhibit the operation enabled state of the operation control section 80 from being maintained as a result of an inadvertent operation of the touch pads 14 by the driver 34.

In addition, in this exemplary embodiment, the operation input device 10 includes the projection surface 60 of the head-up display 20 that the driver 34 can view and the display control section 86 that can control the projection surface 60 and to which the signal S2 can be input. The display control section 86 switches the projection surface 60 to the first display state indicating the operation enabled state in a case where the signal S2 has been input. Alternatively, in a case where the signal S2 is not being input, the display control section 86 switches the projection surface 60 to the second display state indicating the operation prevented state. For this reason, the driver 34 can visually check whether or not the operation targets of the touch pads 14 are in an operable state.

Consequently, in this exemplary embodiment, the driver 34 can perform operation inputs on the operation input device 10 without removing his/her hands from the steering wheel 24, and at the same time inadvertent operations of the operation input device 10 by the driver 34 can be inhibited.

(1) In the embodiment, the operation input device 10 includes the tactile switches 50, but the operation input device 10 is not limited to this. That is, depending on the operation targets of the touch pads 14 and the touch pads 16, for example, the operation input device 10 may also have a configuration that does not include the tactile switches 50.

(2) Furthermore, in the embodiment, depending on the specifications of the vehicle 12, for example, the operation input device 10 may also be provided with a device that adjusts the sensitivity of the touch pads 14 and the touch pads 16, so that the driver 34 can operate the touch pads 14 and the touch pads 16 while wearing gloves.

(3) Furthermore, in the embodiment, the operation input device 10 is installed in the vehicle 12, but the operation input device 10 can be installed in various transportation devices, such as boats.

What is claimed is:

1. An operation input device comprising:
a first detection section, provided at an operating portion that is operable to steer a transportation device, the first detection section including a first detection surface that detects a position at which a detection target is touching the first detection surface as a result of a user operation, the first detection section outputting a first signal representing the position;
an operation control section that controls a first operation target based on the first signal;
an operation determination section that outputs a second signal only in a case where it has determined, based on the first signal, that the detection target is touching the first detection surface and has moved a predetermined distance along the first detection surface while touching the first detection surface; and
a switching control section that switches the operation control section between an operation enabled state in which control of the first operation target by the operation control section is enabled, and an operation prevented state in which control of the first operation target by the operation control section is prevented, the switching control section switching the operation control section from the operation prevented state to the operation enabled state in a case in which the second signal has been received,
wherein the switching control section measures an amount of time in which the first signal is not being received by the operation control section in the operation enabled state, and
the switching control section switches the operation control section to the operation prevented state in a case in which the amount of time has reached a predetermined un-operated time period, and
wherein the switching control section can change a length of the un-operated time period in accordance with a driving state of the transportation device.

2. The operation input device of claim 1, wherein:
the operating portion includes a second detection section that has a second detection surface that detects a state in which the detection target is touching or within a predetermined distance of the second detection surface, the second detection section outputting a third signal in a state in which the detection target is touching or within a predetermined distance of the second detection surface, and
the operation control section controls a second operation target based on the third signal.

3. The operation input device of claim 1, wherein:
the first detection surface is dividable into a plurality of operation regions corresponding to a plurality of the first operation targets, and
the operation control section controls the first operation target corresponding to the operation region closest to the position among the plural operation regions based on the first signal.

4. The operation input device of claim 1, further comprising:
a display section; and
a display control section that controls the display section and that receives the second signal,
wherein the display control section switches the display section to a first display state indicating the operation enabled state in a case in which the second signal has been received, and switches the display section to a second display state indicating the operation prevented state in a case in which the second signal is not being received.

5. An operation input method comprising:
detecting a position at which, as a result of a user operation, a detection target is touching a detection surface of a detection section provided at an operating portion that is operable to steer a transportation device;
outputting, from the detection section, a first signal representing the position;
outputting a second signal, from an operation determination section, only in a case in which the operation determination section has determined, based on the first signal, that the detection target is touching the detection section surface and has moved a predetermined distance along the detection surface while touching the detection surface;
switching, by a switching control section, an operation control section to an operation enabled state in which control of an operation target by the operation control section is enabled in a case in which the second signal has been input to the switching control section; and
switching, by the switching control section, the operation control section to an operation prevented state in which control of the operation target by the operation control section is prevented in a case in which the second signal is not input to the switching control section, wherein the switching control section measures an amount of time in which the first signal is not being received by the operation control section in the operation enabled state, and the switching control section switches the operation control section to the operation prevented state in a case in which the amount of time has reached a predetermined un-operated time period, and wherein the switching control section can change a length of the un-operated time period in accordance with a driving state of the transportation device.

6. A non-transitory computer-readable medium storing an operation input program that causes a computer to execute:

detecting a position in which a detection target is touching a detection surface of a detection section provided at an operating portion used to steer a transportation device;

outputting, from the detection section, a first signal representing the position;

outputting a second signal, from an operation determination section, only in a case in which the operation determination section has determined, based on the first signal, that the detection target is touching the detection surface and has moved a predetermined distance along the detection surface while touching the detection surface;

switching, via a switching control section, an operation control section to an operation enabled state in which control of an operation target by the operation control section is enabled in a case in which the second signal has been input to the switching control section; and switching, by the switching control section, the operation control section to an operation prevented state in which control of the operation target by the operation control section is prevented in a case in which the second signal is not input to the switching control section, wherein the switching control section measures an amount of time in which the first signal is not being received by the operation control section in the operation enabled state, and the switching control section switches the operation control section to the operation prevented state in a case in which the amount of time has reached a predetermined un-operated time period, and wherein the switching control section can change a length of the un-operated time period in accordance with a driving state of the transportation device.

7. An operation input device including:

a first detection section, provided at an operating portion that is operable to steer a transportation device, the first detection section including a first detection surface that detects a position at which detection target is touching or within a predetermined distance of the first detection surface as a result of a user operation, the first detection section outputs a first signal representing the position, a memory, and at least one processor coupled to the first detection section and the memory, the processor being configured to:

receive a first signal representing the position from the first detection section;

determine, based on the first signal, whether the detection target is touching the first detection surface and has moved a predetermined distance along the detection surface while touching the detection surface;

in a case in which it is determined that the detection target has moved, set an operation enabled state in which control of an operation target is enabled; and in a case in which it is determined that the detection target has not moved, set an operation prevented state in which control of the operation target by the operation control section is prevented; and wherein the processor is further configured to measure the amount of time in which the first signal is not being received, and switch to the operation prevented state in a case where the amount of time has reached a predetermined un-operated time period; and the processor is additionally configured to be able to change a length of the un-operated time period in accordance with a driving state of the transportation device.

8. The operation input device of claim 7, wherein:

the operating portion includes a second detection section that has a second detection surface that detects a state in which the detection target is touching or within a predetermined distance of the second detection surface, the second detection section outputs a second signal in a state in which the detection target is touching or within a predetermined distance of the second detection surface, and the processor is configured to control a second operation target based on the second signal.

9. The operation input device of claim 7, wherein:

the first detection surface is dividable into a plurality of operation regions corresponding to a plurality of the first operation targets, and the processor is configured to control the first operation target corresponding to the operation region closest to the position among the plural operation regions based on the first signal.

10. The operation input device of claim 7, further comprising a display section that is coupled to the processor, wherein the processor is configured to control the display section, and wherein the processor is configured to switch the display section to a first display state indicating the operation enabled state in a case in which it is determined that the detection target has moved, and to switch the display section to a second display state indicating the operation prevented state in a case in which it is determined that the detection target has not moved.

* * * * *